(12) United States Patent
Kodama et al.

(10) Patent No.: US 12,279,492 B2
(45) Date of Patent: Apr. 15, 2025

(54) OPTICAL MODULE AND IMAGE DISPLAY DEVICE

(71) Applicant: SEIKO EPSON CORPORATION, Tokyo (JP)

(72) Inventors: Takumi Kodama, Chino (JP); Yuiga Hamade, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 314 days.

(21) Appl. No.: 17/703,963

(22) Filed: Mar. 24, 2022

(65) Prior Publication Data

US 2022/0310764 A1   Sep. 29, 2022

(30) Foreign Application Priority Data

Mar. 25, 2021   (JP) .................... 2021-051766

(51) Int. Cl.
*H10K 59/131* (2023.01)
*G02B 17/08* (2006.01)
(Continued)

(52) U.S. Cl.
CPC ......... *H10K 59/131* (2023.02); *G02B 17/086* (2013.01); *G02B 27/0172* (2013.01);
(Continued)

(58) Field of Classification Search
CPC ............ G02B 27/0172; G02B 27/0176; G02B 2027/0178; G02B 2027/0114;
(Continued)

(56) References Cited

U.S. PATENT DOCUMENTS

| 7,545,349 B2 | 6/2009 | Yamada |
| 11,327,327 B2 | 5/2022 | Hamade et al. |

(Continued)

FOREIGN PATENT DOCUMENTS

| JP | 2003202837 | 7/2003 |
| JP | 2005326830 | 11/2005 |

(Continued)

*Primary Examiner* — Britt D Hanley
*Assistant Examiner* — Victor V Barzykin
(74) *Attorney, Agent, or Firm* — JCIPRNET

(57) ABSTRACT

An optical module of the present disclosure includes a first panel including a first light-emitting element, a first power supply wiring and a second power supply wiring; a second panel including a second light-emitting element having light emission luminance per unit current lower than that of the first light-emitting element, a third power supply wiring and a fourth power supply wiring; and a prism configured to synthesize first image light emitted from the first panel and second image light emitted from the second panel. A first potential difference is smaller than a second potential difference, the first potential difference being a difference between a potential applied to the first power supply wiring and a potential applied to the second power supply wiring, the second potential difference being a difference between a potential applied to the third power supply wiring and a potential applied to the fourth power supply wiring.

8 Claims, 10 Drawing Sheets

(51) Int. Cl.
  G02B 27/01 (2006.01)
  G02B 27/14 (2006.01)
  G03B 21/20 (2006.01)
  H10K 59/32 (2023.01)
(52) U.S. Cl.
  CPC ....... G02B 27/0176 (2013.01); G02B 27/149 (2013.01); G03B 21/2013 (2013.01); G03B 21/2033 (2013.01); G03B 21/2053 (2013.01); H10K 59/32 (2023.02); *G02B 2027/0114* (2013.01); *G02B 2027/0178* (2013.01)
(58) Field of Classification Search
  CPC ................ G02B 27/149; G02B 17/086; G03B 21/2013; G03B 21/2033; G03B 21/2053; H10K 59/131; H10K 59/32
  See application file for complete search history.

(56) References Cited

U.S. PATENT DOCUMENTS

| | | |
|---|---|---|
| 2003/0122813 A1 | 7/2003 | Ishizuki et al. |
| 2003/0128813 A1 | 7/2003 | Appleby et al. |
| 2004/0027545 A1* | 2/2004 | Yokoyama ........ G02F 1/133621 348/E9.027 |
| 2005/0225254 A1* | 10/2005 | Takai .................... G09G 3/3275 315/169.3 |
| 2006/0202630 A1 | 9/2006 | Yamada |
| 2008/0012804 A1 | 1/2008 | Kim et al. |
| 2010/0103078 A1* | 4/2010 | Mukawa ............ G02B 27/0176 345/8 |
| 2013/0128611 A1* | 5/2013 | Akutsu ................ G03H 1/0248 359/629 |
| 2015/0001504 A1* | 1/2015 | Kim ..................... G09G 3/3208 257/40 |
| 2020/0117075 A1 | 4/2020 | Koshihara |
| 2020/0278559 A1* | 9/2020 | Hamade .................. H10K 59/90 |

FOREIGN PATENT DOCUMENTS

| | | |
|---|---|---|
| JP | 2006119274 | 5/2006 |
| JP | 2006250992 | 9/2006 |
| JP | 2008015524 | 1/2008 |
| JP | 2020060685 | 4/2020 |
| JP | 2020140910 | 9/2020 |

* cited by examiner

|  |  | Red | Green | Blue | White (RGB TOTAL) |
|---|---|---|---|---|---|
| PANEL MAXIMUM LUMINANCE [cd/m²] | | 6000 | 34880 | 2640 | 43520 |
| TARGET LUMINANCE [cd/m²] SET LUMINANCE OF EACH COLOR TO R:G:B=3:6:1 | R PANEL MAXIMUM LUMINANCE REFERENCE | 6000 | 12000 | 2000 | 20000 |
| | G PANEL MAXIMUM LUMINANCE REFERENCE | 17440 | 34880 | 5813 | 58133 |
| | B PANEL MAXIMUM LUMINANCE REFERENCE | 7920 | 15840 | 2640 | 26400 |

FIG. 7

|  | Red | Green | Blue | White (RGB TOTAL) |
|---|---|---|---|---|
| POWER-SOURCE POTENTIAL DIFFERENCE [V] | 6.0 | 5.5 | 5.9 | |
| PTARGET LUMINANCE [cd/m²] | 6000 | 12000 | 2000 | 20000 |
| PANEL MAXIMUM LUMINANCE [cd/m²] | 6000 | 12266 | 2005 | 20271 |

FIG. 8

|  | Red | Green | Blue | White (RGB TOTAL) |
|---|---|---|---|---|
| POWER-SOURCE POTENTIAL DIFFERENCE [V] | 6.4 | 6.0 | 6.3 | |
| PTARGET LUMINANCE [cd/m²] | 17440 | 34880 | 5813 | 58133 |
| PANEL MAXIMUM LUMINANCE [cd/m²] | 17492 | 34880 | 5886 | 58258 |

FIG. 9

|  | Red | Green | Blue | White (RGB TOTAL) |
|---|---|---|---|---|
| POWER-SOURCE POTENTIAL DIFFERENCE [V] | 6.1 | 5.6 | 6.0 | |
| PTARGET LUMINANCE [cd/m²] | 7920 | 15840 | 2640 | 26400 |
| PANEL MAXIMUM LUMINANCE [cd/m²] | 8003 | 15863 | 2640 | 26507 |

FIG. 10

OPTICAL MODULE AND IMAGE DISPLAY DEVICE

The present application is based on, and claims priority from JP Application Serial Number 2021-051766, filed Mar. 25, 2021, the disclosure of which is hereby incorporated by reference herein in its entirety.

BACKGROUND

1. Technical Field

The present disclosure relates to an optical module and an image display device.

2. Related Art

JP-A-2020-60685 discloses an optical module including three panels that emit image light with colors different from each other, and a prism that synthesizes the image light emitted from the three panels. As a panel that emits image light, a self-luminous electrooptic device such as an organic electro luminescence (EL) panel is known. The optical modules of this type have been used for image display devices such as head-mounted displays and projectors.

The optical module disclosed in JP-A-2020-60685 includes a panel including a light-emitting element that emits red light, a panel including a light-emitting element that emits green light, and a panel including a light-emitting element that emits blue light. The light-emitting elements differ in light emission luminance per unit current. Therefore, when the power-source potential difference between the power supply wiring on the anode side of the light-emitting element and the power supply wiring on the cathode side of the light-emitting element is the same among the three panels, the light emission luminance at the application of a largest current differs among the panels. As a result, in some cases, the steady driving power of a specific panel of the three panels is increased more than necessary.

SUMMARY

To solve the above-mentioned problems, an optical module of an aspect of the present disclosure includes a first panel including a first light-emitting element, a first power supply wiring provided on one electrode side of the first light-emitting element, and a second power supply wiring provided on another electrode side of the first light-emitting element, a second panel including a second light-emitting element having light emission luminance per unit current lower than that of the first light-emitting element, a third power supply wiring provided on one electrode side of the second light-emitting element, and a fourth power supply wiring provided on another electrode side of the second light-emitting element, and a prism configured to synthesize first image light emitted from the first panel and second image light emitted from the second panel. A first potential difference is smaller than a second potential difference, the first potential difference being a difference between a potential applied to the first power supply wiring and a potential applied to the second power supply wiring, the second potential difference being a difference between a potential applied to the third power supply wiring and a potential applied to the fourth power supply wiring.

An image display device of an aspect of the present disclosure includes the optical module of the aspect of the present disclosure.

BRIEF DESCRIPTION OF THE DRAWINGS

FIG. 7 is a diagram illustrating three patterns for setting a target luminance of each panel such that the luminance ratio of RGB is close to "R:G:B=3:6:1".

FIG. 8 illustrates a relationship between each power-source potential difference set to a value that can ensure the target luminance of each panel, and the maximum luminance of each panel obtained by each set power-source potential difference in a case where a first setting pattern based on the maximum luminance of the third panel is used.

FIG. 9 illustrates a relationship between each power-source potential difference set to a value that can ensure the target luminance of each panel, and the maximum luminance of each panel obtained by each set power-source potential difference in a case where the second setting pattern based on the maximum luminance of the first panel is used.

FIG. 10 illustrates a relationship between each power-source potential difference set to a value that can ensure the target luminance of each panel, and the maximum luminance of each panel obtained by each set power-source potential difference in a case where the third setting pattern based on the maximum luminance of the second panel is used.

DESCRIPTION OF EXEMPLARY EMBODIMENTS

Figure 1:
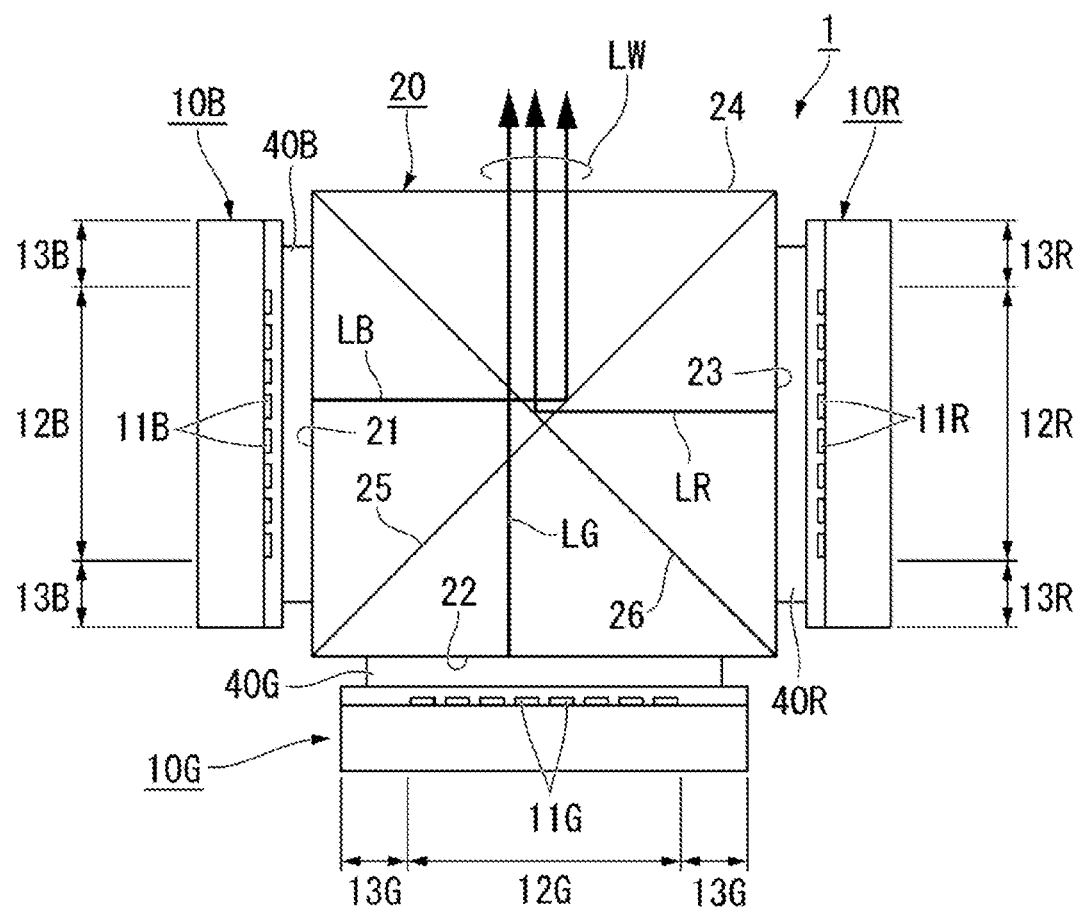
FIG. 1 is a diagram illustrating a schematic configuration of an optical module according to an embodiment of the present disclosure.

An embodiment of the present disclosure is described below with reference to the drawings.

Note that in the drawings described below, some components may be illustrated with different dimensions for the sake of clarity of the illustration of components.

Optical Module

FIG. 1 is a diagram illustrating a schematic configuration of an optical module 1 according to an embodiment of the present disclosure. As illustrated in FIG. 1, the optical module 1 includes a first panel 10G, a second panel 10B, a third panel 10R, and a dichroic prism 20 (prism).

The first panel 10G is a self-luminous electrooptic device that emits first image light LG to the dichroic prism 20. The second panel 10B is a self-luminous electrooptic device that emits second image light LB to the dichroic prism 20. The third panel 10R is a self-luminous electrooptic device that emits third image light LR to the dichroic prism 20. A self-luminous electrooptic device is a device that generates light on its own with an externally supplied electric energy without the need for a light source such as a backlight. In this embodiment, the first panel 10G, the second panel 10B and the third panel 10R are organic EL panels, for example.

The first panel 10G emits color light corresponding to the green wavelength range as the first image light LG. The green wavelength range includes wavelengths from 495 nm to 570 nm, for example. In the following description, the color light corresponding to the green wavelength range may be referred to as "green light". The first panel 10G includes a plurality of first pixels 11G. The plurality of first pixels 11G are disposed in a matrix on a substrate of the first panel 10G. The first pixel 11G emits green light. The first image light LG emitted from the first panel 10G includes the green light emitted from each of the plurality of first pixels 11G.

The first panel 10G includes a first pixel region 12G including the plurality of first pixels 11G disposed in a matrix, and a first non-pixel region 13G that surrounds the periphery of the first pixel region 12G. In a state of facing a green light incidence surface 22 of the dichroic prism 20, the first panel 10G is bonded to the green light incidence surface 22 through an optically transparent first adhesive layer 40G. In other words, the first panel 10G is disposed such that the first image light LG perpendicularly impinges on the green light incidence surface 22.

The second panel 10B emits color light corresponding to the blue wavelength range as second image light LB. The blue wavelength range includes wavelengths from 450 nm to 490 nm for example. In the following description, the color light corresponding to the blue wavelength range may be referred to as "blue light". The second panel 10B includes a plurality of second pixels 11B. The plurality of the second pixels 11B are disposed in a matrix on a substrate of the second panel 10B. The second pixel 11B emits blue light. The second image light LB emitted from the second panel 10B includes the blue light emitted from each of the plurality of the second pixels 11B.

The second panel 10B includes a second pixel region 12B including the plurality of the second pixels 11B disposed in a matrix, and a second non-pixel region 13B that surrounds the periphery of the second pixel region 12B. In a state of facing a blue light incidence surface 21 of the dichroic prism 20, the second panel 10B is bonded to the blue light incidence surface 21 through an optically transparent second adhesive layer 40B. In other words, the second panel 10B is disposed such that the second image light LB perpendicularly impinges on the blue light incidence surface 21.

The third panel 10R emits color light corresponding to the red wavelength range as the third image light LR. The red wavelength range includes wavelengths from 610 nm to 680 nm, for example. In the following description, the color light corresponding to the red wavelength range may be referred to as "red light". The third panel 10R includes a plurality of third pixels 11R. The plurality of third pixels 11R are disposed in a matrix on a substrate of the third panel 10R. The third pixel 11R emits red light. The third image light LR emitted from the third panel 10R includes the red light emitted from each of the plurality of third pixels 11R.

The third panel 10R includes a third pixel region 12R including the plurality of third pixels 11R disposed in a matrix, and a third non-pixel region 13R that surrounds the periphery of the third pixel region 12R. In a state of facing a red light incidence surface 23 of the dichroic prism 20, the third panel 10R is bonded to the red light incidence surface 23 through an optically transparent third adhesive layer 40R. In other words, the third panel 10R is disposed such that the third image light LR perpendicularly impinges on the red light incidence surface 23.

Each of the first image light LG, the second image light LB, and the third image light LR does not have polarization characteristics. Specifically, each of the first image light LG, the second image light LB, and the third image light LR is unpolarized light that does not have a specific vibration direction. Note that unpolarized light, i.e., light that does not have polarization characteristics, is light that is not in a completely unpolarized state, but includes some polarization components with a polarization, such as 20%, which does not actively affect the optical performance of an optical component such as a dichroic mirror.

The dichroic prism 20 is composed of an optically transparent member with a quadrangular prism shape. In addition, the optically transparent member with a quadrangular prism shape is composed of four optically transparent triangular prism members. The dichroic prism 20 includes the blue light incidence surface 21, the red light incidence surface 23 opposite the blue light incidence surface 21, the green light incidence surface 22 in perpendicular contact with the blue light incidence surface 21 and the red light incidence surface 23, and a composite light emission surface 24 opposite the green light incidence surface 22.

The dichroic prism 20 includes a first dichroic mirror 25 that does not have polarization separation characteristics, and a second dichroic mirror 26 that does not have polarization separation characteristics. The first dichroic mirror 25 and the second dichroic mirror 26 intersect each other at an angle of 90°. The first dichroic mirror 25 reflects, toward the composite light emission surface 24, the second image light LB that impinges through the blue light incidence surface 21, and the first dichroic mirror 25 transmits, toward the composite light emission surface 24, the first image light LG that impinges through the green light incidence surface 22. The second dichroic mirror 26 reflects, toward the composite light emission surface 24, the third image light LR that impinges through the red light incidence surface 23, and the second dichroic mirror 26 transmits, toward the composite light emission surface 24, the first image light LG that impinges through the green light incidence surface 22. With the characteristics of the first dichroic mirror 25 and the second dichroic mirror 26, composite image light LW obtained by combining the first image light LG, the second image light LB, and the third image light LR is emitted from the composite light emission surface 24.

Figure 2:
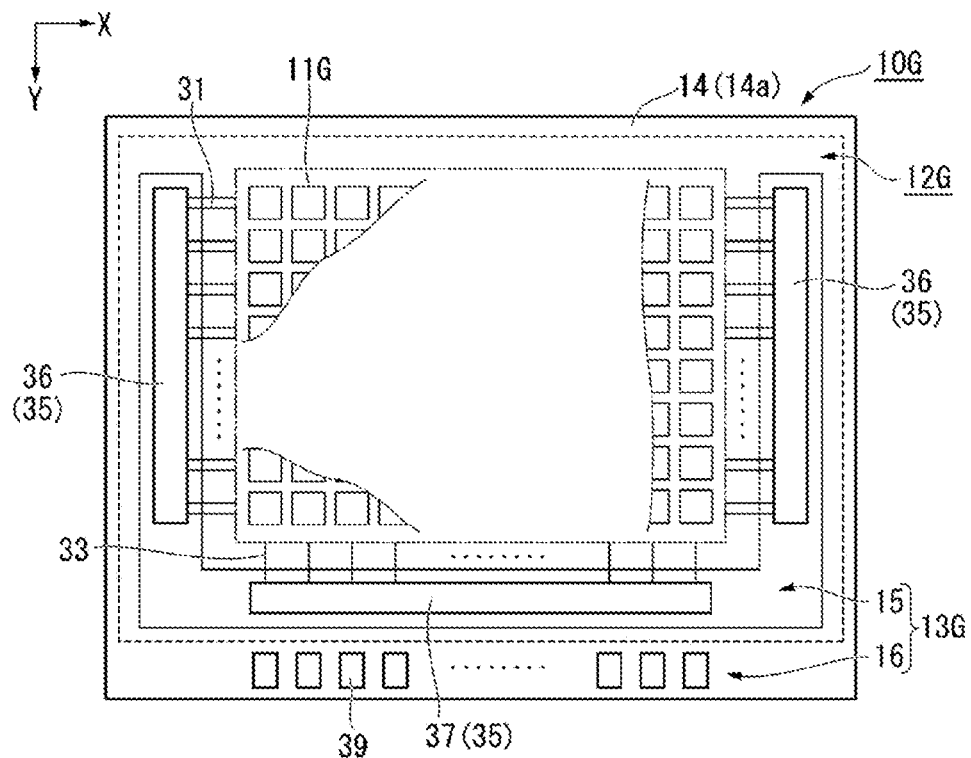
FIG. 2 is a schematic configuration diagram illustrating a general configuration of a first panel including the optical module of the embodiment.

FIG. 2 is a schematic configuration diagram illustrating a general configuration of the first panel 10G.

The first panel 10G, the second panel 10B and the third panel 10R have the same basic configuration, and therefore a general configuration of the first panel 10G is described below as a representative. In FIG. 2, the horizontal direction of the first panel 10G is the X direction, and the vertical direction of the first panel 10G is the Y direction.

As illustrated in FIG. 2, the first pixel region 12G and the first non-pixel region 13G are provided at a first surface 14a of a substrate 14 of the first panel 10G. In addition, the first non-pixel region 13G includes a peripheral region 15 and a mounting region 16. The first pixel region 12G is a rectangular region where the plurality of first pixels 11G are disposed in a matrix. In the first pixel region 12G, a plurality of scan lines 31 extending in the X direction, and a plurality of data lines 33 extending in the Y direction, which intersects the X direction, are provided. The first pixel 11G is a region corresponding to each intersection of the plurality of scan lines 31 and the plurality of data lines 33. Thus, the plurality of first pixels 11G are arranged in a matrix over the X direction and the Y direction. The first pixel 11G includes a pixel circuit illustrated in FIG. 3. The configuration of the pixel circuit provided in the first pixel 11G is described later.

The peripheral region 15 is a region with a rectangular frame shape surrounding the first pixel region 12G. Three driving circuits 35 are provided in the peripheral region 15. The three driving circuits 35 are circuits that drive each first pixel 11G in the first pixel region 12G. The driving circuit 35 includes two scan line driving circuits 36 and a data line driving circuit 37. The first panel 10G is an electrooptic device with a built-in circuit in which the driving circuit 35 is composed of an active element such as a transistor formed on the first surface 14a of the substrate 14.

The mounting region 16 is provided on the side opposite to the first pixel region 12G with the peripheral region 15 therebetween, that is, the outside of the peripheral region 15. A plurality of mounting terminals 39 are provided in the mounting region 16. As elaborated later, a video signal, a power source voltage and the like required for driving the first pixel 11G of the first panel 10G are input to the mounting terminal 39.

Figure 3:
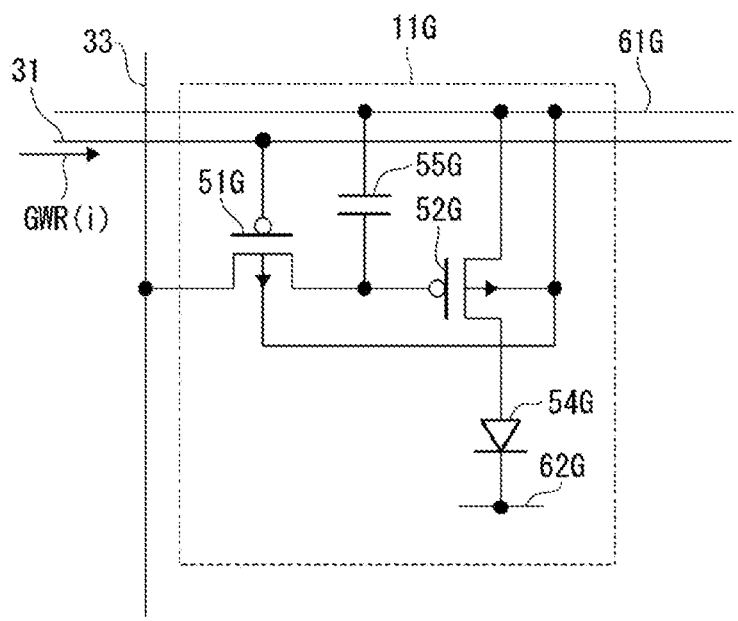
FIG. 3 is an equivalent circuit diagram illustrating a configuration of a pixel circuit provided in a first pixel provided in the first panel of the embodiment.

FIG. 3 is an equivalent circuit diagram illustrating a configuration of a pixel circuit provided in the first pixel 11G.

The configuration of the pixel circuit provided in each of the plurality of first pixels 11G is common, and therefore a pixel circuit provided in the first pixel 11G located at row i column j is described below as an example. Note that the "i" is a symbol that generally represents the number of the row where the first pixel 11G is disposed, and is an integer that is 1 or greater and m or smaller. The "j" is a symbol that generally represents the number of the column where the first pixel 11G is disposed, and is an integer that is 1 or greater and n or smaller.

As illustrated in FIG. 3, the pixel circuit of the first pixel 11G includes a first selection transistor 51G, a first driving transistor 52G, a first light-emitting element 54G, and a first capacitor 55G. In this embodiment, each of the first selection transistor 51G and the first driving transistor 52G is a P-channel type MOS-FET.

The gate electrode of the first selection transistor 51G is electrically coupled with the scan line 31 of the i-th row. The other of the source/drain regions of the first selection transistor 51G is electrically coupled with the data line 33 of the j-th column. One of the source/drain regions of the first selection transistor 51G is electrically coupled with the gate electrode of the first driving transistor 52G and one electrode of the first capacitor 55G. The back gate of the first selection transistor 51G is electrically coupled with the first power supply wiring 61G to which the power-source potential is applied.

The gate electrode of the first driving transistor 52G is electrically coupled with one of the source/drain regions of the first selection transistor 51G and one electrode of the first capacitor 55G. One of the source/drain regions of the first driving transistor 52G is electrically coupled with the first power supply wiring 61G. The other of the source/drain regions of the first driving transistor 52G is electrically coupled with one electrode (anode) of the first light-emitting element 54G. The back gate of the first driving transistor 52G is electrically coupled with the first power supply wiring 61G.

The first light-emitting element 54G is a light-emitting element that emits green light. The first light-emitting element 54G has a configuration in which a light-emitting layer is sandwiched between the anode and cathode, and is for example, an organic EL diode. One electrode (anode) of the first light-emitting element 54G is electrically coupled with the other of the source/drain regions of the first driving transistor 52G. The other electrode (cathode) of the first light-emitting element 54G is electrically coupled with a second power supply wiring 62G to which the power-source potential is applied.

The first capacitor 55G a capacitor for holding the voltage between the gate electrode of the first driving transistor 52G and one of the source/drain regions of the first driving transistor 52G electrically coupled with the first power supply wiring 61G. One electrode of the first capacitor 55G is electrically coupled with one of the source/drain regions of the first selection transistor 51G and the gate electrode of the first driving transistor 52G. The other electrode of the first capacitor 55G is electrically coupled with the first power supply wiring 61G. Note that as the first capacitor 55G, a capacitance parasitic on the gate electrode of the first driving transistor 52G may be used, or a capacitance formed by sandwiching the insulation layer between conductive layers different from each other in the silicon substrate may be used.

In the pixel circuit of the first pixel 11G having the above-mentioned configuration, when a scanning signal GWR (i) supplied to the scan line 31 of the i-th row is a high level, the first selection transistor 51G is in an off state. On the other hand, when the scanning signal GWR (i) is a low level, the first selection transistor 51G is in an on state. When the first selection transistor 51G is in an on state, a charging current flows through the first capacitor 55G in accordance with a potential difference Vd1 between the potential of the data line 33 and the potential of the first power supply wiring 61G, and thus the first capacitor 55G is charged until the interelectrode voltage of the first capacitor 55G becomes the potential difference Vd1.

When the gate potential of the first driving transistor 52G exceeds the threshold value voltage of the first driving transistor 52G, the driving current flows from the first power supply wiring 61G to the second power supply wiring 62G through the first driving transistor 52G and the first light-emitting element 54G. The value of the driving current is controlled by the gate potential of the first driving transistor 52G. The voltage between the gate electrode of the first driving transistor 52G and one of the source/drain regions of the first driving transistor 52G electrically coupled with the first power supply wiring 61G is equal to the voltage held by the first capacitor 55G, i.e., the interelectrode voltage of the first capacitor 55G. Accordingly, a driving current having a current value corresponding to the voltage held by the first capacitor 55G flows through the first light-emitting element 54G, and thus the first light-emitting element 54G emits green light having an intensity corresponding to the driving current.

In the above-mentioned manner, the first panel 10G includes the first light-emitting element 54G that emits green light, which is color light corresponding to the green wavelength range, the first power supply wiring 61G provided on one electrode side (anode side) of the first light-emitting element 54G, and the second power supply wiring 62G provided on the other electrode side (cathode side) of the first light-emitting element 54G. In the following description, the difference between the power-source potential applied to the first power supply wiring 61G and the power-source potential applied to the second power supply wiring 62G may be referred to as "first power-source potential difference (first potential difference)".

Although not illustrated in the drawings, as with the first pixel 11G, the pixel circuit of the second pixel 11B disposed in the second panel 10B includes a second selection transistor 51B, a second driving transistor 52B, a second light-emitting element 54B, and a second capacitor 55B. The second selection transistor 51B and the second driving transistor 52B are P-channel type MOS-FETs.

The gate electrode of the second selection transistor 51B is electrically coupled with the scan line 31 of the i-th row. The other of the source/drain regions of the second selection transistor 51B is electrically coupled with the data line 33 of the j-th column. One of the source/drain regions of the second selection transistor 51B is electrically coupled with the gate electrode of the second driving transistor 52B and one electrode of the second capacitor 55B. The back gate of the second selection transistor 51B is electrically coupled with a third power supply wiring 61B to which the power-source potential is applied.

The gate electrode of the second driving transistor 52B is electrically coupled with one of the source/drain regions of the second selection transistor 51B and one electrode of the second capacitor 55B. One of the source/drain regions of the second driving transistor 52B is electrically coupled with the third power supply wiring 61B. The other of the source/drain regions of the second driving transistor 52B is electrically coupled with one electrode (anode) of the second light-emitting element 54B. The back gate of the second driving transistor 52B is electrically coupled with the third power supply wiring 61B.

The second light-emitting element 54B is a light-emitting element having light emission luminance per unit current lower than that of the first light-emitting element 54G. The second light-emitting element 54B emits blue light, which is color light corresponding to the blue wavelength range. The second light-emitting element 54B has a configuration in which a light-emitting layer is sandwiched between the anode and cathode, and is for example, an organic EL diode. One electrode (anode) of the second light-emitting element 54B is electrically coupled with the other of the source/drain regions of the second driving transistor 52B. The other electrode (cathode) of the second light-emitting element 54B is electrically coupled with a fourth power supply wiring 62B to which the power-source potential is applied.

The second capacitor 55B is a capacitor for holding the voltage between the gate electrode of the second driving transistor 52B and one of the source/drain regions of the second driving transistor 52B electrically coupled with the third power supply wiring 61B. One electrode of the second capacitor 55B is electrically coupled with one of the source/drain regions of the second selection transistor 51B and the gate electrode of the second driving transistor 52B. The other electrode of the second capacitor 55B is electrically coupled with the third power supply wiring 61B. Note that as the second capacitor 55B, a capacitance parasitic on the gate electrode of the second driving transistor 52B may be used, or a capacitance formed by sandwiching the insulation layer between conductive layers different from each other in the silicon substrate may be used.

In the pixel circuit of the second pixel 11B having the above-mentioned configuration, when the second selection transistor 51B is in an on state, a charging current flows through the second capacitor 55B in accordance with a potential difference Vd2 between the potential of the data line 33 and the potential of third power supply wiring 61B, and thus the second capacitor 55B is charged until the interelectrode voltage of the second capacitor 55B becomes the potential difference Vd2.

When the gate potential of the second driving transistor 52B exceeds the threshold value voltage of the second driving transistor 52B, the driving current flows from the third power supply wiring 61B toward the fourth power supply wiring 62B through the second driving transistor 52B and the second light-emitting element 54B. The value of the driving current is controlled by the gate potential of the second driving transistor 52B. The voltage between the gate electrode of the second driving transistor 52B and one of the source/drain regions of the second driving transistor 52B electrically coupled with the third power supply wiring 61B is equal to the voltage held by the second capacitor 55B, i.e., the interelectrode voltage of the second capacitor 55B. Accordingly, a driving current having a current value corresponding to the voltage held by the second capacitor 55B flows through the second light-emitting element 54B, and thus the second light-emitting element 54B emits blue light having an intensity corresponding to the driving current.

In the above-mentioned manner, the second panel 10B includes the second light-emitting element 54B that emits blue light having light emission luminance per unit current lower than that of the first light-emitting element 54G, the third power supply wiring 61B provided on one electrode side (anode side) of the second light-emitting element 54B, and the fourth power supply wiring 62B provided on the other electrode side (cathode side) of the second light-emitting element 54B. In the following description, the difference between the power-source potential applied to the third power supply wiring 61B and the power-source potential applied to the fourth power supply wiring 62B may be referred to as "second power-source potential difference (second potential difference)".

In addition, although not illustrated in the drawings, as with the first pixel 11G and the second pixel 11B, the pixel circuit of the third pixel 11R disposed in the third panel 10R includes a third selection transistor 51R, a third driving transistor 52R, a third light-emitting element 54R, and a third capacitor 55R. The third selection transistor 51R and the third driving transistor 52R are P-channel type MOS-FETs.

The gate electrode of the third selection transistor 51R is electrically coupled with the scan line 31 of the i-th row. The other of the source/drain regions of the third selection transistor 51R is electrically coupled with the data line 33 of the j-th column. One of the source/drain regions of the third selection transistor 51R is electrically coupled with the gate electrode of the third driving transistor 52R and one electrode of the third capacitor 55R. The back gate of the third selection transistor 51R is electrically coupled with a fifth power supply wiring 61R to which the power-source potential is applied.

The gate electrode of the third driving transistor 52R is electrically coupled with one of the source/drain regions of the third selection transistor 51R and one electrode of the third capacitor 55R. One of the source/drain regions of the third driving transistor 52R is electrically coupled with the fifth power supply wiring 61R. The other of the source/drain regions of the third driving transistor 52R is electrically coupled with one electrode (anode) of the third light-emitting element 54R. The back gate of the third driving transistor 52R is electrically coupled with the fifth power supply wiring 61R.

The third light-emitting element 54R is a light-emitting element having light emission luminance per unit current than that of the first light-emitting element 54G. The third light-emitting element 54R emits red light, which is color light corresponding to the red wavelength range. The third light-emitting element 54R has a configuration in which a light-emitting layer is sandwiched between the anode and cathode, and is for example, an organic EL diode. One electrode (anode) of the third light-emitting element 54R is electrically coupled with the other of the source/drain regions of the third driving transistor 52R. The other electrode (cathode) of the third light-emitting element 54R is electrically coupled with a sixth power supply wiring 62R to which the power-source potential is applied.

The third capacitor 55R is a capacitor for holding the voltage between the gate electrode of the third driving transistor 52R and one of the source/drain regions of the third driving transistor 52R electrically coupled with the fifth power supply wiring 61R. One electrode of the third capacitor 55R is electrically coupled with one of the source/drain regions of the third selection transistor 51R and the gate electrode of the third driving transistor 52R. The other electrode of the third capacitor 55R is electrically coupled with the fifth power supply wiring 61R. Note that as the third capacitor 55R, a capacitance parasitic on the gate electrode of the third driving transistor 52R may be used, or a capacitance formed by sandwiching the insulation layer between conductive layers different from each other in the silicon substrate may be used.

In the pixel circuit of the third pixel 11R having the above-mentioned configuration, when the third selection transistor 51R is in an on state, a charging current flows through the third capacitor 55R in accordance with a potential difference between Vd3 between the potential of the data line 33 and the potential of the fifth power supply wiring 61R, and thus the third capacitor 55R is charged until the interelectrode voltage of the third capacitor 55R becomes the potential difference Vd3.

When the gate potential of the third driving transistor 52R exceeds the threshold value voltage of the third driving transistor 52R, the driving current flows from the fifth power supply wiring 61R toward the sixth power supply wiring 62R through the third driving transistor 52R and the third light-emitting element 54R. The value of the driving current is controlled by the gate potential of the third driving transistor 52R. The voltage between the gate electrode of the third driving transistor 52R and one of the source/drain regions of the third driving transistor 52R electrically coupled with the fifth power supply wiring 61R is equal to the voltage held by the third capacitor 55R, i.e., the interelectrode voltage of the third capacitor 55R. Accordingly, a driving current having a current value corresponding to the voltage held by the third capacitor 55R flows through the third light-emitting element 54R, and thus the third light-emitting element 54R emits red light having an intensity corresponding to the driving current.

In the above-mentioned manner, the third panel 10R includes the third light-emitting element 54R that emits red light having light emission luminance per unit current lower than that of the first light-emitting element 54G, the fifth power supply wiring 61R provided on one electrode side (anode side) of the third light-emitting element 54R, and the sixth power supply wiring 62R provided on the other electrode side (cathode side) of the third light-emitting element 54R. In the following description, the difference between the power-source potential applied to the fifth power supply wiring 61R and the power-source potential applied to the sixth power supply wiring 62R may be referred to as "third power-source potential difference (third potential difference)".

In the optical module 1 of this embodiment, the area of the first light-emitting element 54G provided in the first pixel 11G, the area of the second light-emitting element 54B provided in the second pixel 11B, and the area of the third light-emitting element 54R provided in the third pixel 11R are equal to each other. Note that the area of each light-emitting element 54 can be said to be the area of the region where the anode, the light-emitting layer and the cathode overlap each other in plan view, or the area of the region where the anode and the light-emitting layer are in contact.

Note that the polarity of the potential applied to each power supply wiring in the present disclosure is not limited. For example, the potential applied to the first power supply wiring and the potential applied to the second power supply wiring may be positive and negative, respectively, or the potentials applied to the first power supply wiring and the second power supply wiring may be both positive or both negative. In other words, the polarity of the potential applied to each power supply wiring is not limited as long as the power-source potential difference that is the potential difference between the potential applied to the first power supply wiring and the potential applied to the second power supply wiring is a predetermined potential difference.

Figure 4:
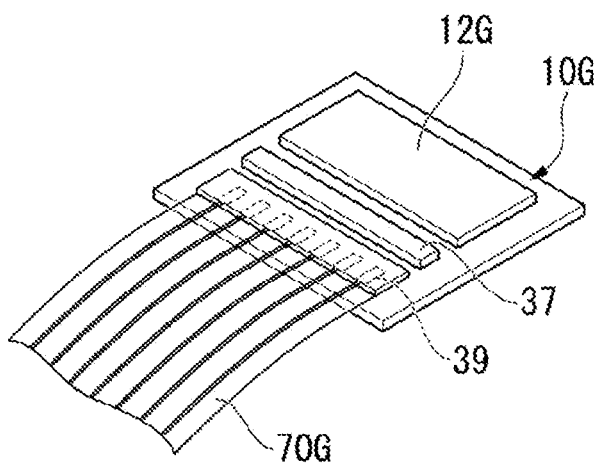
FIG. 4 is a perspective view illustrating an external appearance of the first panel of the embodiment.
Figures 5, 6:
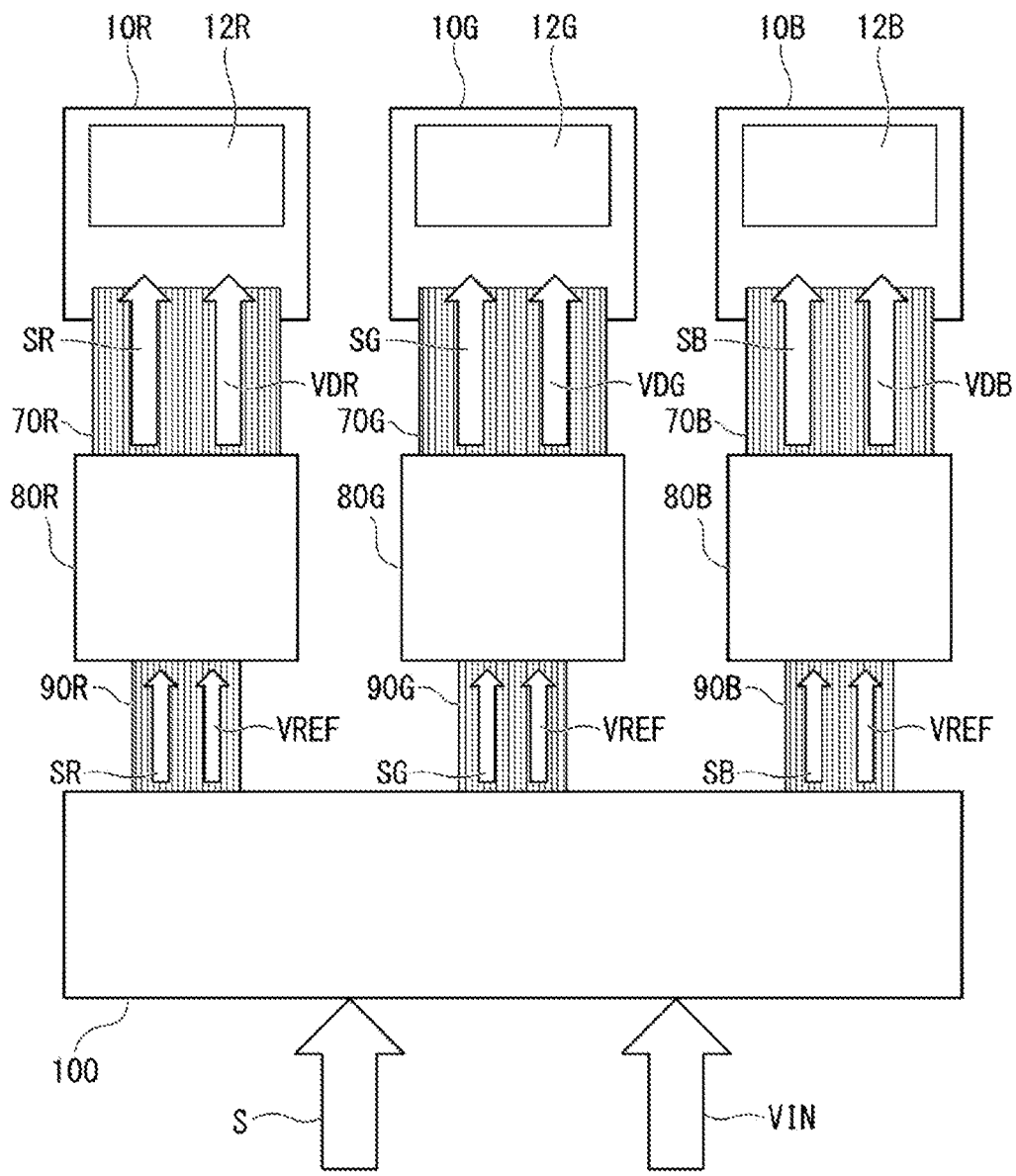
FIG. 5 is a schematic view illustrating configurations of circuit boards coupled with a first panel, a second panel and a third panel.
FIG. 6 is a diagram illustrating an example of a monochromatic maximum luminance of each panel in a case where a power-source potential difference of each panel is set to 6.0 (V), which is a basic preset value.

As illustrated in FIG. 4, the mounting terminal 39 of the first panel 10G is coupled with one connector part of a flexible flat cable 70G. As illustrated in FIG. 5, the other connector part of the flexible flat cable 70G is coupled with a first child substrate 80G. The first child substrate 80G is coupled with a parent substrate 100 through a flexible flat cable 90G.

As illustrated in FIG. 5, as with the first panel 10G, the mounting terminal 39 of the second panel 10B is coupled with a second child substrate 80B through a flexible flat cable 70B. The second child substrate 80B is coupled with the parent substrate 100 through a flexible flat cable 90B. As with the first panel 10G, the mounting terminal 39 of the third panel 10R is coupled with a third child substrate 80R through a flexible flat cable 70R. The third child substrate 80R is coupled with the parent substrate 100 through a flexible flat cable 90R.

A video signal S and an external power source voltage VIN are input to the parent substrate 100. The parent substrate 100 includes a signal processing circuit that separates the externally input video signal S into a green video signal SG for the first panel 10G, a blue video signal SB for the second panel 10B, and a red video signal SR for the third panel 10R. In addition, the parent substrate 100 includes a power supply circuit such as a DC/DC converter that generates a reference voltage VREF from the externally input external power source voltage VIN.

The parent substrate 100 outputs the green video signal SG and the reference voltage VREF to the first child substrate 80G through the flexible flat cable 90G. The parent substrate 100 outputs the blue video signal SB and the reference voltage VREF to the second child substrate 80B through the flexible flat cable 90B. The parent substrate 100 outputs the red video signal SR and the reference voltage VREF to the third child substrate 80R through the flexible flat cable 90R.

The first child substrate 80G includes a power supply circuit such as a DC/DC converter that generates the potential of the first power supply wiring 61G and the potential of the second power supply wiring 62G from the reference voltage VREF input from the parent substrate 100 such that the potential difference therebetween is a first power source voltage VDG. The first child substrate 80G outputs the potential to be supplied to the first power supply wiring 61G and the potential to be supplied to the second power supply wiring 62G, to the mounting terminal 39 of the first panel 10G through the flexible flat cable 70G. In addition, the first child substrate 80G outputs the green video signal SG input from the parent substrate 100, to the mounting terminal 39 of the first panel 10G through the flexible flat cable 70G.

The first power-source potential difference of the first panel 10G is equal to the first power source voltage VDG. In other words, the first power-source potential difference of the first panel 10G may be individually set to any value by a power supply circuit such as a DC/DC converter provided in the first child substrate 80G.

In the first panel 10G, the scan line driving circuit 36 and the data line driving circuit 37 generate a scanning signal to be supplied to the scan line 31 and a potential to be applied to the data line 33 on the basis of the green video signal SG input from the first child substrate 80G to the first panel 10G.

The second child substrate 80B includes a power supply circuit such as a DC/DC converter that generates the potential of third power supply wiring 61B and the potential of the fourth power supply wiring 62B from the reference voltage VREF input from the parent substrate 100 such that the potential difference therebetween is a second power source voltage VDB. The second child substrate 80B outputs the potential to be supplied to the third power supply wiring 61B and the potential to be supplied to the fourth power supply wiring 62B, to the mounting terminal 39 of the second panel 10B through the flexible flat cable 70B. In addition, the second child substrate 80B outputs the blue video signal SB input from the parent substrate 100, to the mounting terminal 39 of the second panel 10B through the flexible flat cable 70B.

The second power-source potential difference of the second panel 10B is equal to the second power source voltage VDB. In other words, the second power-source potential difference of the second panel 10B may be individually set to any value by a power supply circuit such as a DC/DC converter provided in the second child substrate 80B.

In the second panel 10B, the scan line driving circuit 36 and the data line driving circuit 37 generate a scanning signal to be supplied to the scan line 31 and a potential to be applied to the data line 33 on the basis of the blue video signal SB input from the second child substrate 80B to the second panel 10B.

The third child substrate 80R includes a power supply circuit such as a DC/DC converter that generates the potential of the fifth power supply wiring 61R and the potential of the sixth power supply wiring 62R from the reference voltage VREF input from the parent substrate 100 such that the potential difference therebetween is a third power source voltage VDR. The third child substrate 80R outputs the potential to be supplied to the fifth power supply wiring 61R and the potential to be supplied to the sixth power supply wiring 62R, to the mounting terminal 39 of the third panel 10R through the flexible flat cable 70R. In addition, the third child substrate 80R outputs the red video signal SR input from the parent substrate 100, to the mounting terminal 39 of the third panel 10R through the flexible flat cable 70R.

The third power-source potential difference of the third panel 10R is equal to the third power source voltage VDR. In other words, the third power-source potential difference of the third panel 10R may be individually set to any value by a power supply circuit such as a DC/DC converter provided in the third child substrate 80R.

In the third panel 10R, the scan line driving circuit 36 and the data line driving circuit 37 generate a scanning signal to be supplied to the scan line 31 and a potential to be applied to the data line 33 on the basis of the red video signal SR input from the third child substrate 80R to the third panel 10R.

In the optical module 1 having the above-mentioned configuration, the first power-source potential difference of the first panel 10G, the second power-source potential difference of the second panel 10B, and the third power-source potential difference of the third panel 10R are individually set as follows.

FIG. 6 illustrates an exemplary monochromatic maximum luminance of each panel 10 when the power-source potential difference of each panel 10 is set to 6.0 (V), which is a basic preset value. As illustrated in FIG. 6, when the first power-source potential difference of the first panel 10G is set to 6.0 (V), the maximum luminance of the green first image light LG emitted from the first panel 10G is, for example, 34880 ($cd/m^2$). When the second power-source potential difference of the second panel 10B is set to 6.0 (V), the maximum luminance of the blue second image light LB emitted from the second panel 10B is, for example, 2640 ($cd/m^2$). When the third power-source potential difference of the third panel 10R is set to 6.0 (V), the maximum luminance of the red third image light LR emitted from the third panel 10R is, for example, 6000 ($cd/m^2$).

Figure 11:
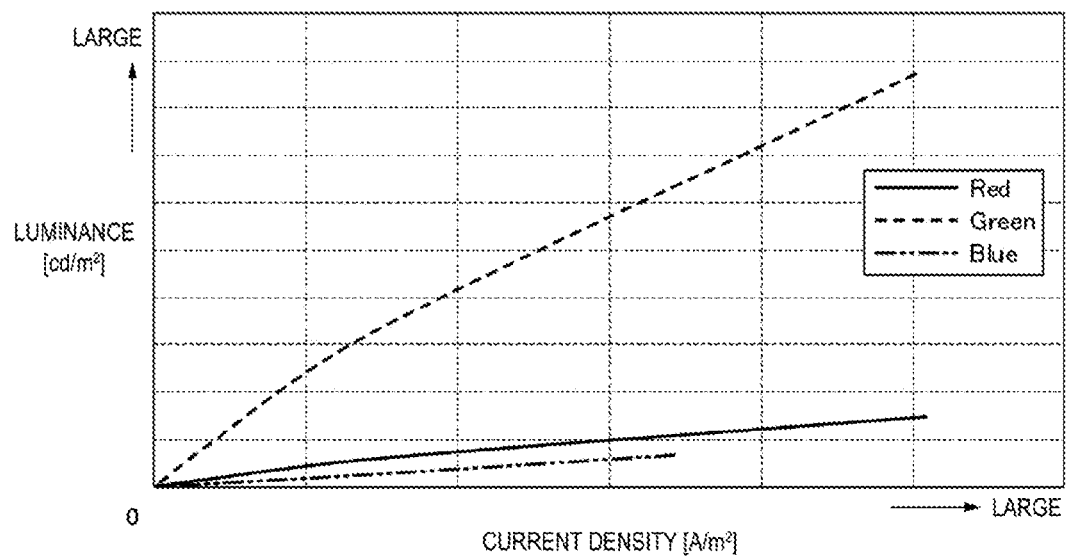
FIG. 11 is a characteristic diagram illustrating a relationship between the current density and the light emission luminance per unit current for each of a first light-emitting element, a second light-emitting element and a third light-emitting element.

FIG. 11 is a characteristic diagram illustrating relationships between the current density and the light emission luminance for each of the first light-emitting element 54G, the second light-emitting element 54B and the third light-emitting element 54R respectively. As illustrated in FIG. 11, the light emission luminance per unit current of the second light-emitting element 54B is lower than that of the first light-emitting element 54G. The light emission luminance per unit current of the third light-emitting element 54R is lower than that of the first light-emitting element 54G, and is greater than that of the second light-emitting element 54B. Accordingly, as illustrated in FIG. 6, when the power-source potential difference of each panel 10 is set to the same value, the light emission luminance at the application of a largest current differs among the panels. To be more specific, the maximum luminance of the second panel 10B is lower than the maximum luminance of the first panel 10G, and the maximum luminance of the third panel 10R is lower than the maximum luminance of the first panel 10G and higher than the maximum luminance of the second panel 10B. As a result, when the power-source potential difference of each panel 10 is set to the same value, the steady driving power of a specific panel in three panels 10 is increased more than necessary in some cases.

In the optical module 1 of this embodiment, the target luminance of each panel 10 is set such that the luminance ratio of RGB is close to "R:G:B=3:6:1" with the maximum luminance illustrated in FIG. 6 as the upper limit in order to ensure a color reproducibility comparable to that of commonly used displays. Note that "R" represents the luminance of the red third image light LR emitted from the third panel 10R. "G" represents the luminance of the green first image light LG emitted from the first panel 10G. "B" represents the luminance of the blue second image light LB emitted from the second panel 10B.

Note that performing the control such that the luminance ratio of RGB is close to "R:G:B=3:6:1" is merely an example, and the luminance ratio of RGB is not limited to this.

As illustrated in FIG. 7, three setting patterns of the target luminance of each panel 10 are conceivable. The first setting pattern is a pattern of setting the target luminance of each panel 10 such that the luminance ratio of RGB is close to "R:G:B=3:6:1" with respect to the maximum luminance of the third panel 10R. The second setting pattern is a pattern of setting the target luminance of each panel 10 such that the luminance ratio of RGB is close to "R:G:B=3:6:1" with respect to the maximum luminance of the first panel 10G. The third setting pattern is a pattern of setting the target luminance of each panel 10 such that the luminance ratio of RGB is close to "R:G:B=3:6:1" with respect to the maximum luminance of the second panel 10B.

In FIG. 7, in the case of the first setting pattern based on the maximum luminance of the third panel 10R, the maximum luminance regarding the first panel 10G is higher than the target luminance. Therefore, if the first power-source potential difference of the first panel 10G is set to 6.0 (V), the first power source voltage VDG that is excessive for the target luminance of the first panel 10G is supplied to the first panel 10G. Likewise, in the case of the first setting pattern in FIG. 7, the maximum luminance regarding the second panel 10B is also higher than the target luminance. Therefore, if the second power-source potential difference of the second panel 10B is set to 6.0 (V), the second power source voltage VDB that is excessive for the target luminance of the second panel 10B is supplied to the second panel 10B.

In view of this, in the optical module 1 of this embodiment, in the case where the first setting pattern based on the maximum luminance of the third panel 10R is used, the first power-source potential difference is set to the minimum value that can ensure the target luminance of the first panel 10G, and the second power-source potential difference is set to the minimum value that can ensure the target luminance of the second panel 10B.

FIG. 8 illustrates a relationship between each power-source potential difference set to a value that can ensure the target luminance of each panel 10, and the maximum luminance of each panel 10 obtained with each set power-source potential difference in the case where the first setting pattern based on the maximum luminance of the third panel 10R is used. As illustrated in FIG. 8, in the optical module 1 of this embodiment, the first power-source potential difference of the first panel 10G is set to 5.5 (V), the second power-source potential difference of the second panel 10B is set to 5.9 (V), and the third power-source potential difference of the third panel 10R is set to 6.0 (V) in the case where the first setting pattern is used.

In this case, in order to set the first power source voltage VDG (the first power-source potential difference) to 5.5 (V), it is supplied to each power supply wiring from the first child substrate 80G to the first panel 10G; in order to set the second power source voltage VDB (the second power-source potential difference) to 5.9 (V), it is supplied to each power supply wiring from the second child substrate 80B to the second panel 10B; and in order to set the third power source voltage VDR (the third power-source potential difference) to 6.0 (V), it is supplied to each power supply wiring from the third child substrate 80R to the third panel 10R. As a result, as illustrated in FIG. 8, a maximum luminance of the target luminance or greater is achieved for each panel 10, and the target luminance of each panel 10 set such that the luminance ratio of RGB is close to "R:G:B=3:6:1" is ensured.

In this manner, in the case where the first setting pattern based on the maximum luminance of the third panel 10R is used, the power consumption of the first panel 10G and the second panel 10B can be reduced in comparison with the third panel 10R while optimizing the white balance by setting the first power-source potential difference of the first panel 10G and the second power-source potential difference of the second panel 10B to a minimum value while ensuring the target luminance of each panel 10 set such that the luminance ratio of RGB is close to "R:G:B=3:6:1".

In the case where the first setting pattern is used, the first power-source potential difference of the first panel 10G is smaller than the second power-source potential difference of the second panel 10B, and smaller than the third power-source potential difference of the third panel 10R. Accordingly, the power consumption of the first panel 10G is smaller than that of the second panel 10B and the third panel 10R. In addition, the second power-source potential difference of the second panel 10B is smaller than the third power-source potential difference of the third panel 10R, and greater than the first power-source potential difference of the first panel 10G. Accordingly, the power consumption of the second panel 10B is smaller than the third panel 10R and greater than the first panel 10G. In the case where the first setting pattern is used, the maximum luminance of the third panel 10R is higher than the maximum luminance of the second panel 10B and lower than the maximum luminance of the first panel 10G.

In FIG. 7, in the case of the second setting pattern based on the maximum luminance of the first panel 10G, the maximum luminance regarding the second panel 10B is lower than the target luminance. Therefore, if the second power-source potential difference of the second panel 10B is set to 6.0 (V), the second power source voltage VDB that is insufficient for the target luminance of the second panel 10B is supplied to the second panel 10B. Likewise, in the case of the second setting pattern in FIG. 7, the maximum luminance regarding the third panel 10R is also lower than the target luminance. Therefore, if the third power-source potential difference of the third panel 10R is set to 6.0 (V), the third power source voltage VDR that is insufficient for the target luminance of the third panel 10R is supplied to the third panel 10R.

In view of this, in the optical module 1 of this embodiment, in the case where the second setting pattern based on the maximum luminance of the first panel 10G is used, the second power-source potential difference is set to a value greater than the basic preset value in order to ensure the target luminance of the second panel 10B, and the third power-source potential difference is set to a value greater than the basic preset value in order to ensure the target luminance of the third panel 10R.

FIG. 9 illustrates a relationship between each power-source potential difference set to a value that can ensure the target luminance of each panel 10, and the maximum luminance of each panel 10 obtained with each set power-source potential difference in the case where the second setting pattern based on the maximum luminance of the first panel 10G is used. As illustrated in FIG. 9, in the optical module 1 of this embodiment, in the case where the second setting pattern is used, the first power-source potential difference of the first panel 10G is set to 6.0 (V), the second power-source potential difference of the second panel 10B is set to 6.3 (V), and the third power-source potential difference of the third panel 10R is set to 6.4 (V).

In this case, in order to set the first power source voltage VDG (the first power-source potential difference) to 6.0 (V), it is supplied to each power supply wiring from the first child substrate 80G to the first panel 10G; in order to set the second power source voltage VDB (the second power-source potential difference) to 6.3 (V), it is supplied to each power supply wiring from the second child substrate 80B to the second panel 10B; and in order to set the third power source voltage VDR (the third power-source potential difference) to 6.4 (V), it is supplied to each power supply wiring from the third child substrate 80R to the third panel 10R. As a result, as illustrated in FIG. 9, a maximum luminance of the target luminance or greater is achieved for each panel 10, and the target luminance of each panel 10 set such that the luminance ratio of RGB is close to "R:G:B=3: 6:1" is ensured.

In this manner, in the case where the second setting pattern based on the maximum luminance of the first panel 10G is used, the power consumption of the first panel 10G and the second panel 10B can be reduced in comparison with the third panel 10R while optimizing the white balance by setting the second power-source potential difference of the second panel 10B and the third power-source potential difference of the third panel 10R to a value greater than the basic preset value while ensuring the target luminance of each panel 10 set such that the luminance ratio of RGB is close to "R:G:B=3:6:1".

As with the case where the first setting pattern is used, also in the case where the second setting pattern is used, the first power-source potential difference of the first panel 10G is smaller than the second power-source potential difference of the second panel 10B, and smaller than the third power-source potential difference of the third panel 10R. Accordingly, the power consumption of the first panel 10G is smaller than that of the second panel 10B and the third panel 10R. In addition, the second power-source potential difference of the second panel 10B is smaller than the third power-source potential difference of the third panel 10R, and greater than the first power-source potential difference of the first panel 10G. Accordingly, the power consumption of the second panel 10B is smaller than the third panel 10R and greater than the first panel 10G. Also in the case where the second setting pattern is used, the maximum luminance of the third panel 10R is higher than the maximum luminance of the second panel 10B and lower than the maximum luminance of the first panel 10G.

In addition, as illustrated in FIG. 8, the maximum luminance of white is approximately 20000 (cd/m$^2$) in the case where the first setting pattern is used, whereas the maximum luminance of white increases to approximately 58000 (cd/m$^2$) in the case where the second setting pattern is used as illustrated in FIG. 9. Thus, a higher luminance of the optical module 1 can be achieved by using the second setting pattern in comparison with the first setting pattern.

In FIG. 7, in the case of the third setting pattern based on the maximum luminance of the second panel 10B, the maximum luminance regarding the first panel 10G is higher than the target luminance. Therefore, if the first power-source potential difference of the first panel 10G is set to 6.0 (V), the first power source voltage VDG that is excessive for the target luminance of the first panel 10G is supplied to the first panel 10G. In addition, in the case of the third setting pattern in FIG. 7, the maximum luminance regarding the third panel 10R is lower than the target luminance. Therefore, if the third power-source potential difference of the third panel 10R is set to 6.0 (V), the third power source voltage VDR that is insufficient for the target luminance of the third panel 10R is supplied to the third panel 10R.

In view of this, in the optical module 1 of this embodiment, in the case where the third setting pattern based on the maximum luminance of the second panel 10B is used, the first power-source potential difference is set to the minimum value that can ensure the target luminance of the first panel 10G, and the third power-source potential difference is set to a value greater than the basic preset value in order to ensure the target luminance of the third panel 10R.

FIG. 10 illustrates a relationship between each power-source potential difference set to a value that can ensure the target luminance of each panel 10, and the maximum luminance of each panel 10 obtained with each set power-source potential difference in the case where the third setting pattern based on the maximum luminance of the second panel 10B is used. As illustrated in FIG. 10, in the optical module 1 of this embodiment, the first power-source potential difference of the first panel 10G is set to 5.6 (V), the second power-source potential difference of the second panel 10B is set to 6.0 (V), and the third power-source potential difference of the third panel 10R is set to 6.1 (V) in the case where the third setting pattern is used.

In this case, in order to set the first power source voltage VDG (the first power-source potential difference) to 5.6 (V), it is supplied to each power supply wiring from the first child substrate 80G to the first panel 10G; in order to set the second power source voltage VDB (the second power-source potential difference) to 6.0 (V), it is supplied to each power supply wiring from the second child substrate 80B to the second panel 10B; and in order to set the third power source voltage VDR (the third power-source potential difference) to 6.1 (V), it is supplied to each power supply wiring from the third child substrate 80R to the third panel 10R. As a result, as illustrated in FIG. 10, a maximum luminance of the target luminance or greater is achieved for each panel 10, and the target luminance of each panel 10 set such that the luminance ratio of RGB is close to "R:G:B=3: 6:1" is ensured.

In this manner, in the case where the third setting pattern based on the maximum luminance of the second panel 10B is used, the power consumption of the first panel 10G and the second panel 10B can be reduced in comparison with the third panel 10R while optimizing the white balance by setting the first power-source potential difference of the first panel 10G to the minimum value and setting the third power-source potential difference of the third panel 10R to a value greater than the basic preset value while ensuring the target luminance of each panel 10 set such that the luminance ratio of RGB is close to "R:G:B=3:6:1".

As with the case where the first setting pattern is used, even in the case where the third setting pattern is used, the first power-source potential difference of the first panel 10G is smaller than the second power-source potential difference of the second panel 10B, and smaller than the third power-source potential difference of the third panel 10R. Accordingly, the power consumption of the first panel 10G is smaller than that of the second panel 10B and the third panel 10R. In addition, the second power-source potential difference of the second panel 10B is smaller than the third power-source potential difference of the third panel 10R, and greater than the first power-source potential difference of the first panel 10G. Accordingly, the power consumption of the second panel 10B is smaller than the third panel 10R and greater than the first panel 10G. Even in the case where the third setting pattern is used, the maximum luminance of the third panel 10R is higher than the maximum luminance of the second panel 10B and lower than the maximum luminance of the first panel 10G.

In addition, as illustrated in FIG. 8, the maximum luminance of white is approximately 20000 (cd/m$^2$) in the case where the first setting pattern is used, whereas the maximum luminance of white increases to approximately 26000 (cd/m$^2$) in the case where the third setting pattern is used as illustrated in FIG. 10. Thus, a higher luminance of the optical module 1 can be achieved by using the third setting pattern in comparison with the first setting pattern. Note that the effect of achieving a higher luminance of the optical module 1 is maximized by using the second setting pattern among the three setting patterns as described above.

In the above-mentioned manner, the optical module 1 of this embodiment can reduce the power consumption of the first panel 10G and the second panel 10B in comparison with the third panel 10R while optimizing the white balance by individually setting the first power-source potential difference of the first panel 10G, the second power-source potential difference of the second panel 10B, and the third power-source potential difference of the third panel 10R to a value that can ensure the target luminance of each panel 10 even in the case where light-emitting elements 54 differing in light emission luminance per unit current are provided in the panels 10.

Image Display Device Provided with Optical Module

An image display device provided with the optical module 1 of the embodiment is described below.

Figure 12:
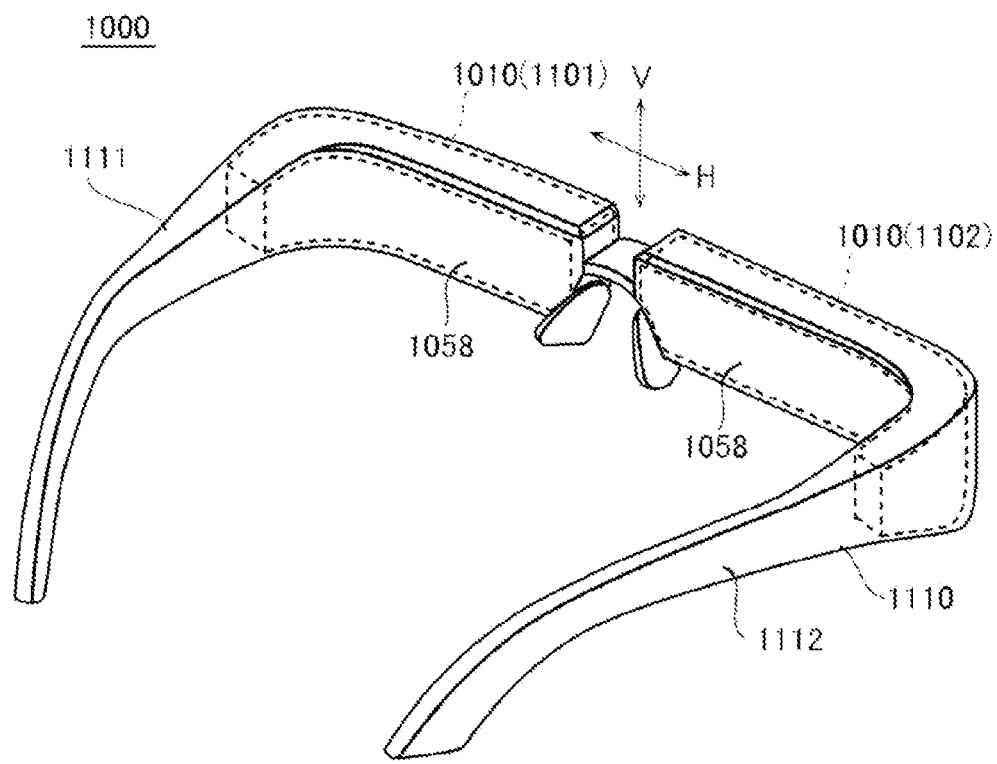
FIG. 12 schematically illustrates a head-mounted display device as an example of an image display device provided with the optical module of the embodiment.
Figure 13:
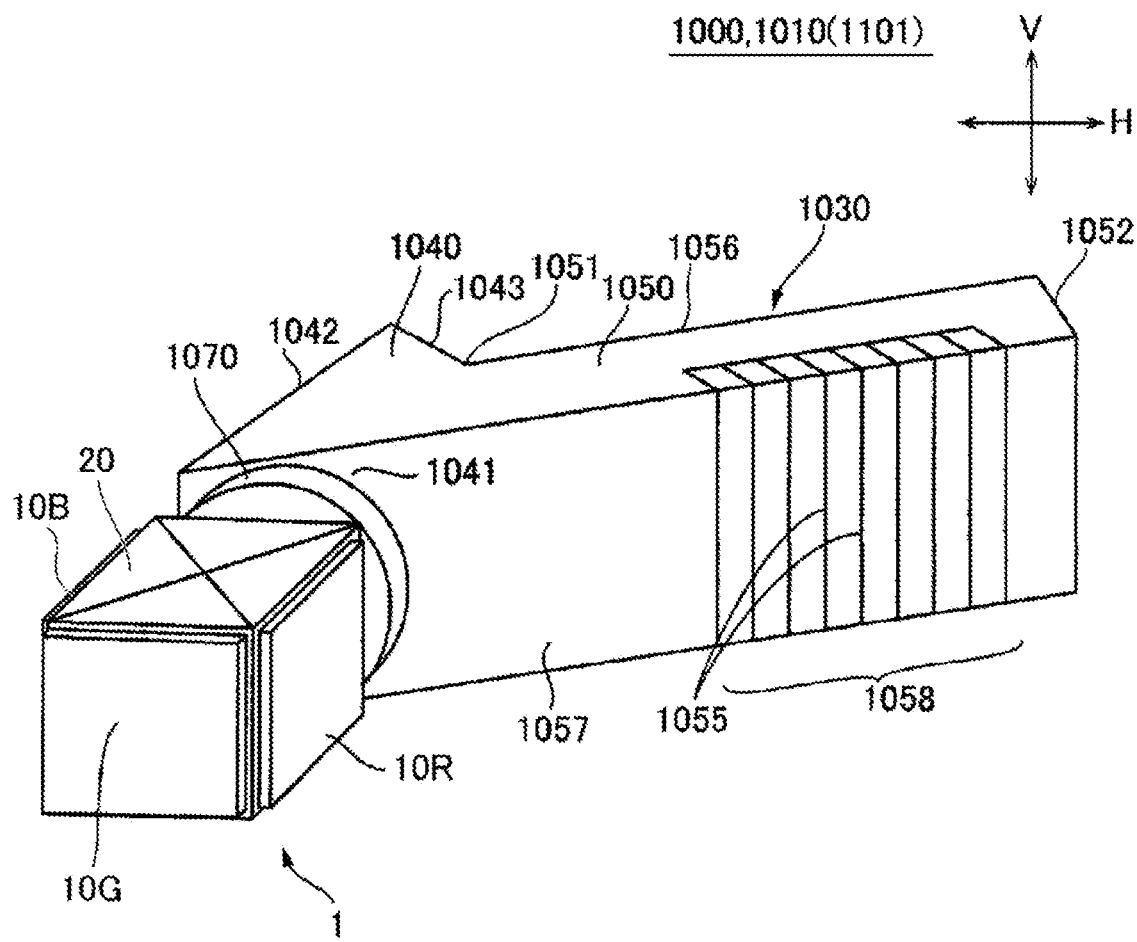
FIG. 13 is a perspective view schematically illustrating a configuration of an optical system of a virtual image display unit in a head-mounted display device.
Figure 14:
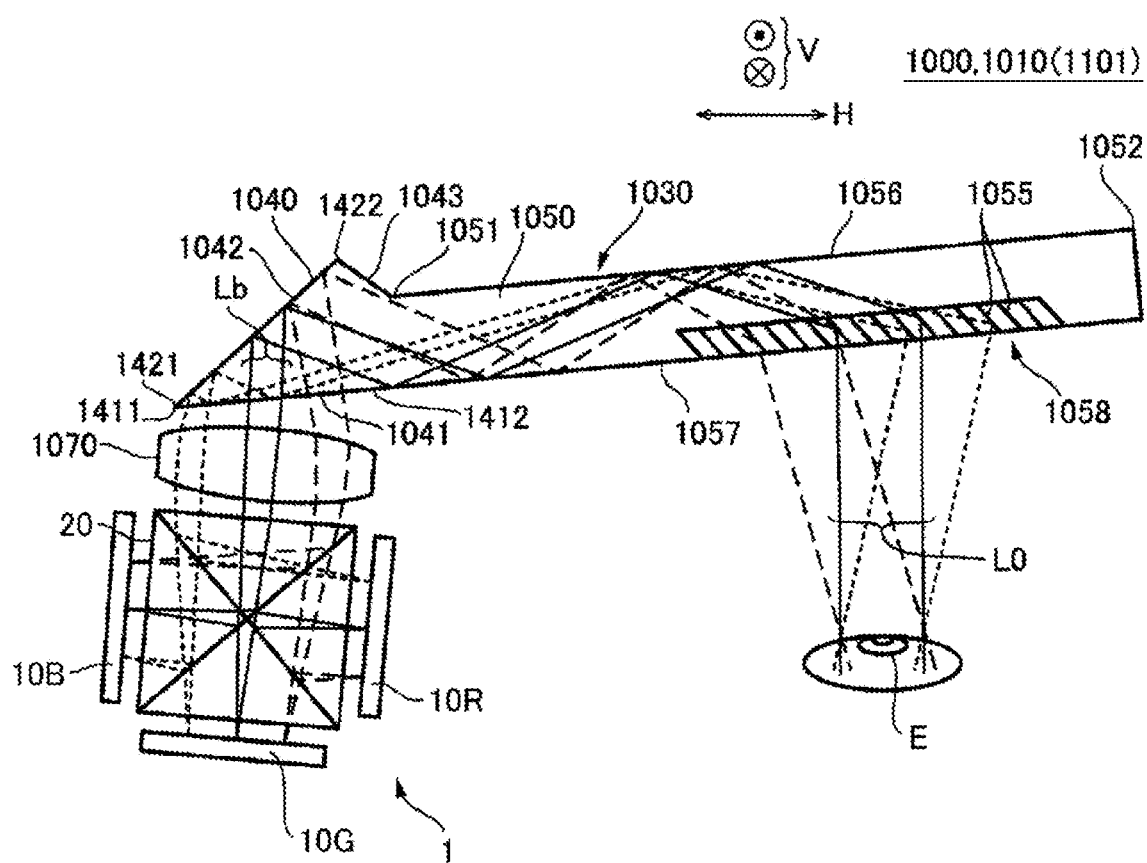
FIG. 14 is an explanatory diagram illustrating light paths of an optical system of a virtual image display unit in a head-mounted display device.

FIG. 12 is an explanatory diagram of a head-mounted display device (head-mounted display) 1000 that is an example of an image display device provided with the optical module 1. FIG. 13 is a perspective view schematically illustrating a configuration of an optical system of a virtual image display unit 1010 illustrated in FIG. 12. FIG. 14 is an explanatory diagram illustrating light paths of the optical system illustrated in FIG. 13.

As illustrated in FIG. 12, the head-mounted display device 1000 is configured as a see-through eyeglass-display, and includes a frame 1110 with temples 1111 and 1112 on the left and right sides. In the head-mounted display device 1000, the virtual image display unit 1010, which is supported by the frame 1110, makes the user recognize an image emitted from the virtual image display unit 1010 as a virtual image. In this embodiment, the head-mounted display device 1000 includes a left-eye display unit 1101 and a right-eye display unit 1102, as the virtual image display unit 1010. The left-eye display unit 1101 and the right-eye display unit 1102 have the same configuration and are disposed in a bilaterally symmetric manner.

In the following description, the left-eye display unit 1101 is mainly described, and the description of the right-eye display unit 1102 will be omitted.

In the following description, the left-eye display unit 1101 is mainly described, and the description of the right-eye display unit 1102 will be omitted. A projection lens system 1070 is disposed between the optical module 1 and the light guiding system 1030. The composite image light LW emitted from the optical module 1 impinges on the light guiding system 1030 through the projection lens system 1070. The projection lens system 1070 is composed of one collimator lens with a positive power.

The light guiding system 1030 includes an optically transparent incident part 1040 where the composite image light LW impinges, and an optically transparent light guiding part 1050 whose one end 1051 side is coupled with the incident part 1040. In this embodiment, the incident part 1040 and the light guiding part 1050 are composed of an integrated optically transparent member.

The incident part 1040 includes an incidence surface 1041 where the composite image light LW emitted from the optical module 1 impinges, and a reflecting surface 1042 that reflects the composite image light LW entered from the incidence surface 1041 between the incidence surface 1041 and the incidence surface 1041. The incidence surface 1041 is composed of a flat surface, an aspherical surface, a free curved surface or the like, and faces the optical module 1 through the projection lens system 1070. The projection lens system 1070 is obliquely disposed in such a manner that the distance from an end portion 1412 of the incidence surface 1041 is greater than the distance from an end portion 1411 of the incidence surface 1041.

No reflection film is formed at the incidence surface 1041, but it totally reflects light that impinges at an angle equal to or greater than the critical angle. Therefore, the incidence surface 1041 has light transmitting and light reflecting properties. The reflecting surface 1042 is composed of a surface opposite to the incidence surface 1041, and is obliquely disposed such that an end portion 1422 is separated from the incidence surface 1041 than an end portion 1421 of the incidence surface 1041. Thus, the incident part 1040 has a triangular-like shape. The reflecting surface 1042 is composed of a flat surface, an aspherical surface, a free curved surface or the like. The reflecting surface 1042 has a configuration in which a reflective metal layer whose main component is aluminum, silver, magnesium, chromium and the like is formed.

The light guiding part 1050 includes a first surface 1056 (first reflecting surface) extending from the one end 1051 toward the other end 1052 side, a second surface 1057 (second reflecting surface) extending from the one end 1051 side toward the other end 1052 side in parallel to and opposite to the first surface 1056, and the emission unit 1058 provided in a portion separated from the incident part 1040 in the second surface 1057. The first surface 1056 and the reflecting surface 1042 of the incident part 1040 are contiguous through a tilted surface 1043. The thickness of the first surface 1056 and the second surface 1057 is smaller than that of the incident part 1040. The first surface 1056 and the second surface 1057 totally reflect light that impinges at an incident angle equal to or greater than the critical angle on the basis of the refractive index difference between the light guiding part 1050 and the outside (air). Therefore, no reflection film is formed at the first surface 1056 and the second surface 1057.

The emission unit 1058 is configured in a part on the second surface 1057 side in the thickness direction in the light guiding part 1050. In the emission unit 1058, a plurality of partial reflection surfaces 1055 obliquely tilted to the normal direction to the second surface 1057 are disposed in parallel. The emission unit 1058 is a portion that overlaps the plurality of partial reflection surfaces 1055 in the second surface 1057 and is a region with a predetermined width in the extending direction of the light guiding part 1050. Each of the plurality of partial reflection surfaces 1055 is composed of a dielectric multi layer film. In addition, at least one of the plurality of partial reflection surfaces 1055 may be a composite layer of a dielectric multi layer film, and a reflective metal layer (thin film) whose main component is aluminum, silver, magnesium, chromium and the like. In the case where the partial reflection surface 1055 includes a metal layer, an effect of increasing the reflectivity of the partial reflection surface 1055, or an effect of optimizing the incident angle dependence and polarization dependence of the reflectivity and the transmittance of the partial reflection surface 1055 is achieved. Note that the emission unit 1058 may have a configuration provided with an optical element such as a diffraction grating and a hologram.

In the head-mounted display device 1000 with the above-mentioned configuration, the composite image light LW composed of parallel light entered from the incident part 1040 is refracted at the incidence surface 1041 toward the reflecting surface 1042. Next, the composite image light LW is reflected at the reflecting surface 1042 toward the incidence surface 1041 again. At this time, the composite image light LW impinges on the incidence surface 1041 at an incident angle equal to or greater than the critical angle, and thus the composite image light LW is reflected at the incidence surface 1041 toward the light guiding part 1050. Note that while the composite image light LW that is parallel light impinges on the incidence surface 1041 at the incident part 1040 in this configuration, it is also possible to adopt a configuration in which the incidence surface 1041 and the reflecting surface 1042 are composed of a free curved surface or the like and the composite image light LW that is non-parallel light incident on the incidence surface 1041 is then converted to parallel light while it is reflected between the reflecting surface 1042 and the incidence surface 1041.

In the light guiding part 1050, the composite image light LW travels through reflection between the first surface 1056 and the second surface 1057. A part of the composite image light LW that impinges on the partial reflection surface 1055 is reflected at the partial reflection surface 1055 and emitted from the emission unit 1058 toward an eye E of the viewer. In addition, the remaining part of the composite image light LW that impinges on the partial reflection surface 1055 passes through the partial reflection surface 1055 and impinges on the next adjacent partial reflection surface 1055. Thus, the composite image light LW reflected at each of the plurality of partial reflection surfaces 1055 is emitted from the emission unit 1058 toward the eye E of the viewer. In this manner, the viewer can recognize the virtual image.

At this time, the light that impinges on the light guiding part 1050 from the outside reaches the eye E of the viewer through the partial reflection surface 1055 after impinging on the light guiding part 1050. Thus, the viewer can visually recognize a color image emitted from the optical module 1, and can visually recognize the outside scenery and the like in a see-through manner.

With the head-mounted display device 1000 provided with the above-described optical module 1 of this embodiment, the power consumption of the first panel 10G and the second panel 10B can be reduced in comparison with the third panel 10R while optimizing the white balance of the color image visually recognized by the eye E of the viewer.

Figure 15:
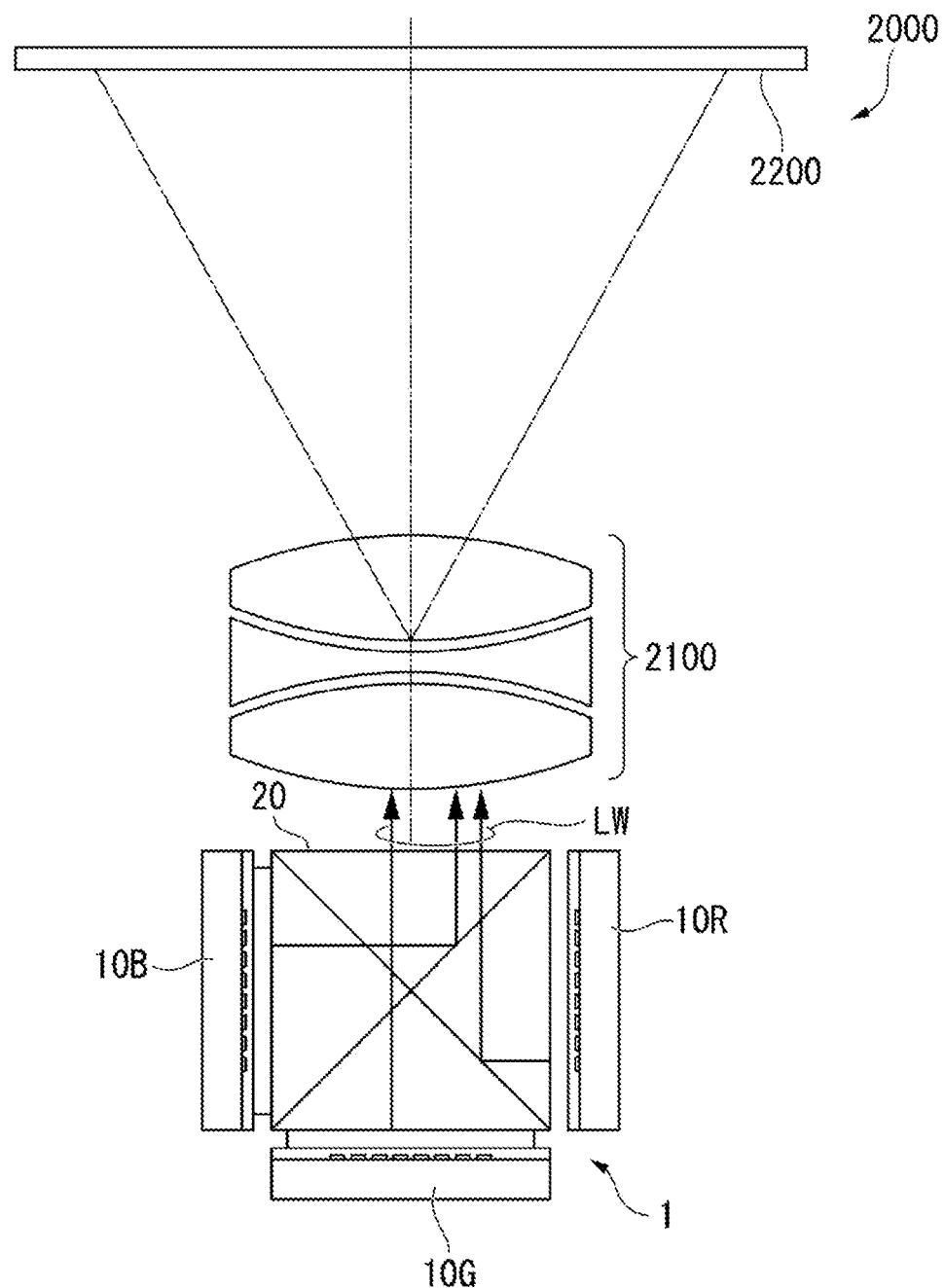
FIG. 15 is a diagram schematically illustrating a projection type display device as an example of the image display device provided with the optical module of the embodiment.

FIG. 15 is a diagram illustrating a schematic configuration of a projection type display device (projector) 2000 that is another example of an image display device provided with the optical module 1 of this embodiment. As illustrated in FIG. 15, the projection type display device 2000 includes the above-described optical module 1 of the embodiment, and a projection optical system 2100 that projects the composite image light LW emitted from the optical module 1 on a projection target member 2200 such as a screen in an enlarged manner.

With the projection type display device 2000 including the optical module 1 of this embodiment, the power consumption of the first panel 10G and the second panel 10B can be reduced in comparison with the third panel 10R while optimizing the white balance of the composite image light LW projected on the projection target member 2200.

Modification

Note that the technical scope of the present disclosure is not limited to the above-described embodiments, and various modifications may be made without departing from the gist of the present disclosure.

In the above-mentioned embodiment, an exemplary configuration is described in which the first child substrate 80G generates the potential of the first power supply wiring 61G and the potential of the second power supply wiring 62G from the reference voltage VREF input from the parent substrate 100 such that the potential difference therebetween is the first power source voltage VDG, the second child substrate 80B generates the potential of third power supply wiring 61B and the potential of the fourth power supply wiring 62B from the reference voltage VREF input from the parent substrate 100 such that the potential difference therebetween is the second power source voltage VDB, and the third child substrate 80R generates the potential of the fifth power supply wiring 61R and the potential of the sixth power supply wiring 62R from the reference voltage VREF input from the parent substrate 100 such that the potential difference therebetween is the third power source voltage VDR.

Figure 16:
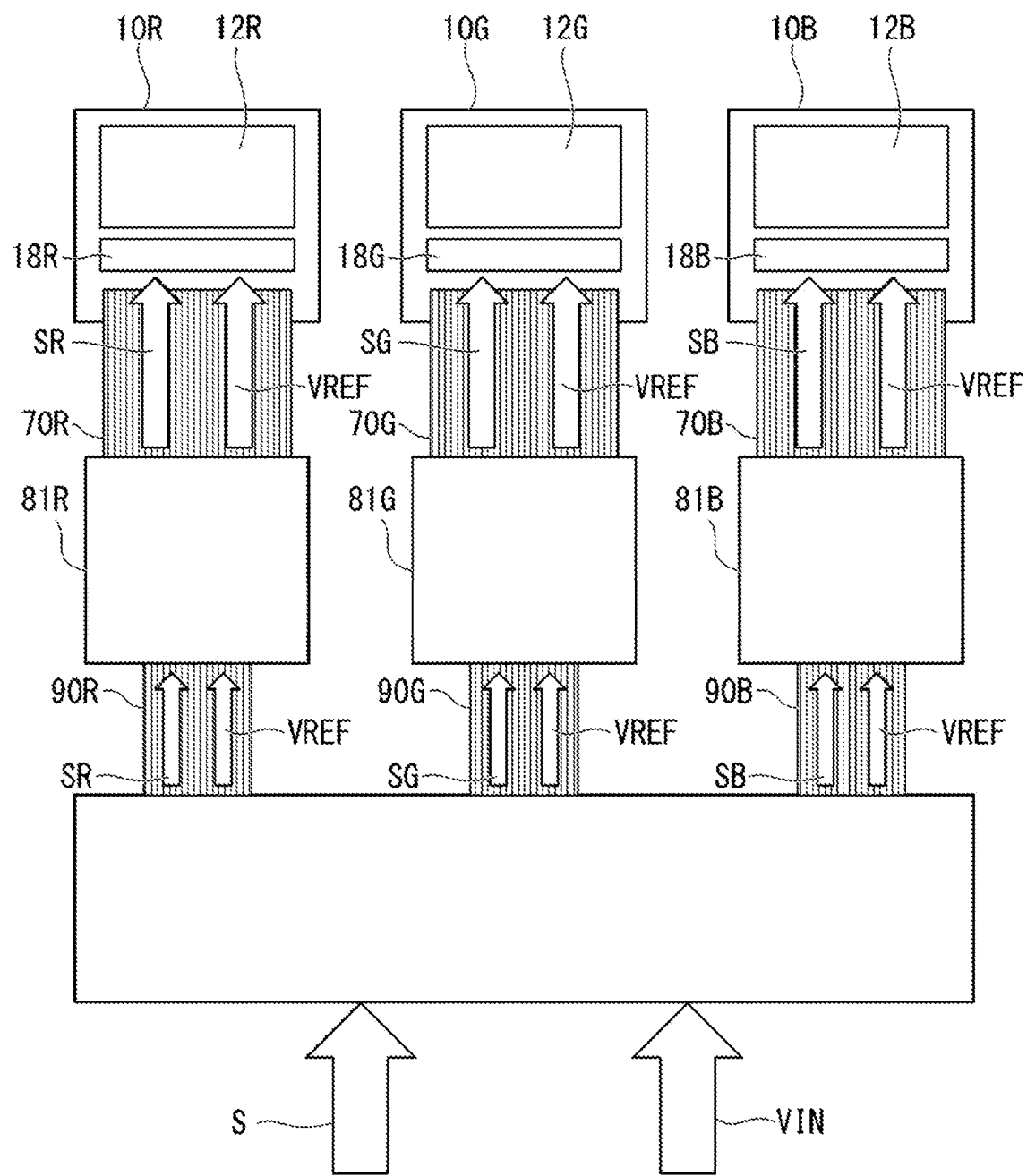
FIG. 16 is a schematic view illustrating a modification of the circuit boards coupled with the first panel, the second panel and the third panel.

For example, as illustrated in FIG. 16, a first child substrate 81G may be provided in place of the first child substrate 80G, a second child substrate 81B may be provided in place of the second child substrate 80B, and a third child substrate 81R may be provided in place of the third child substrate 80R. The first child substrate 81G outputs the reference voltage VREF and the green video signal SG input from the parent substrate 100, to the first panel 10G through the flexible flat cable 70G. The second child substrate 81B outputs the reference voltage VREF and the blue video signal SB input from the parent substrate 100, to the second panel 10B through the flexible flat cable 70B. The third child substrate 81R outputs the reference voltage VREF and the red video signal SR input from the parent substrate 100, to the third panel 10R through the flexible flat cable 70R.

As illustrated in FIG. 16, the first panel 10G may include a power supply circuit 18G such as a DC/DC converter that generates the potential of the first power supply wiring 61G and the potential of the second power supply wiring 62G from the reference voltage VREF input from the first child substrate 81G such that the potential difference therebetween is the first power source voltage VDG. The second panel 10B may include a power supply circuit 18B such as a DC/DC converter that generates the potential of third power supply wiring 61B and the potential of the fourth power supply wiring 62B from the reference voltage VREF input from the second child substrate 81B such that the potential difference therebetween is the second power source voltage VDB. The third panel 10R may include a power supply circuit 18R such as a DC/DC converter that generates the potential of the fifth power supply wiring 61R and the potential of the sixth power supply wiring 62R from the reference voltage VREF input from the third child substrate 81R such that the potential difference therebetween is the third power source voltage VDR.

The modification illustrated in FIG. 16 can also individually set the first power-source potential difference of the first panel 10G, the second power-source potential difference of the second panel 10B, and the third power-source potential difference of the third panel 10R to a value that can ensure the target luminance of each panel 10.

In the above-mentioned embodiment, each light-emitting element organic is an EL diode, but the present disclosure is not limited to this. As each light-emitting element, it is possible to use other self-luminous elements such as an inorganic EL element, an LED array, an organic LED, a laser array, and a quantum dot light-emitting element.

In the above-mentioned embodiment, the head-mounted display device 1000 and the projection type display device 2000 are exemplified as image display devices provided with the optical module 1, but the optical module of the present disclosure is applicable to various image display devices.

An optical module of an aspect of the present disclosure may have the following configuration.

An optical module of an aspect of the present disclosure includes a first panel including a first light-emitting element, a first power supply wiring provided on one electrode side of the first light-emitting element, and a second power supply wiring provided on another electrode side of the first light-emitting element, a second panel including a second light-emitting element having light emission luminance per unit current lower than that of the first light-emitting element, a third power supply wiring provided on one electrode side of the second light-emitting element, and a fourth power supply wiring provided on another electrode side of the second light-emitting element, and a prism configured to synthesize first image light emitted from the first panel and second image light emitted from the second panel. A first potential difference is smaller than a second potential difference, the first potential difference being a difference between a potential applied to the first power supply wiring and a potential applied to the second power supply wiring, the second potential difference being a difference between a potential applied to the third power supply wiring and a potential applied to the fourth power supply wiring.

The optical module of an aspect of the present disclosure further includes a third panel including a third light-emitting element having light emission luminance per unit current lower than that of the first light-emitting element, a fifth power supply wiring provided on one electrode side of the third light-emitting element, and a sixth power supply wiring provided on another electrode side of the third light-emitting element. The prism synthesizes the first image light, the second image light, and third image light emitted from the third panel, and the first potential difference is smaller than a third potential difference that is a difference between a potential applied to the fifth power supply wiring and a potential applied to the sixth power supply wiring.

In the optical module of an aspect of the present disclosure, the first panel emits color light corresponding to a green wavelength range as the first image light.

In the optical module of an aspect of the present disclosure, the second panel emits color light corresponding to a blue wavelength range as the second image light, the third panel emits color light corresponding to a red wavelength range as the third image light, the second potential difference is smaller than the third potential difference, and a maximum luminance of the third panel is higher than a maximum luminance of the second panel and lower than a maximum luminance of the first panel.

An image display device of an aspect of the present disclosure may have the following configuration.

An image display device of an aspect of the present disclosure includes the optical module of the aspect of the present disclosure.

What is claimed is:

1. An optical module comprising:
    a parent substrate including a power supply circuit to which a power source voltage is supplied and generating a first reference voltage and a second reference voltage;
    a first substrate including a power supply circuit to which the first reference voltage is supplied and generating a first potential and a second potential;
    a second substrate including a power supply circuit to which the second reference voltage is supplied and generating a third potential and a fourth potential;
    a first panel including:
        a first light-emitting element;
        a first power supply wiring provided on one electrode side of the first light-emitting element and to which the first potential is supplied; and
        a second power supply wiring provided on another electrode side of the first light-emitting element and to which the second potential is supplied;
    a second panel including:
        a second light-emitting element having light emission luminance per unit current lower than that of the first light-emitting element;
        a third power supply wiring provided on one electrode side of the second light-emitting element and to which the third potential is supplied; and
        a fourth power supply wiring provided on another electrode side of the second light-emitting element and to which the fourth potential is supplied; and
    a prism configured to synthesize a first image light emitted from the first panel and a second image light emitted from the second panel,
    wherein a first potential difference is smaller than a second potential difference, the first potential difference being a difference between the first potential and the second potential, the second potential difference being a difference between the third potential and the fourth potential.

2. The optical module according to claim 1, further comprising:
    a third substrate including a power supply circuit to which a third reference voltage is supplied and generating a fifth potential and a sixth potential;
    a third panel including:
        a third light-emitting element having light emission luminance per unit current lower than that of the first light-emitting element;
        a fifth power supply wiring provided on one electrode side of the third light-emitting element and to which the fifth potential is supplied; and
        a sixth power supply wiring provided on another electrode side of the third light-emitting element and to which the sixth potential is supplied, wherein
    the prism synthesizes the first image light, the second image light, and a third image light emitted from the third panel; and
    the first potential difference is smaller than a third potential difference that is a difference between the fifth potential and the sixth potential.

3. The optical module according to claim 2, wherein the first panel emits a color light corresponding to a green wavelength range as the first image light.

4. The optical module according to claim 2, wherein
    the second panel emits a color light corresponding to a blue wavelength range as the second image light;
    the third panel emits a color light corresponding to a red wavelength range as the third image light;

the second potential difference is smaller than the third potential difference; and a maximum luminance of the third panel is higher than a maximum luminance of the second panel and lower than a maximum luminance of the first panel.

5. An image display device comprising the optical module according to claim 1.

6. An image display device comprising the optical module according to claim 2.

7. An optical module comprising:
- a parent substrate including a power supply circuit to which a power source voltage is supplied and generating a first reference voltage and a second reference voltage;
- a first substrate including a power supply circuit to which the first reference voltage is supplied and generating a first potential and a second potential;
- a second substrate including a power supply circuit to which the second reference voltage is supplied and generating a third potential and a fourth potential;
- a first panel including:
  - a first light-emitting element;
  - a first power supply wiring electrically coupled with one electrode of the first light-emitting element and to which the first potential is supplied; and
  - a second power supply wiring electrically coupled with another electrode of the first light-emitting element and to which the second potential is supplied;
- a second panel including:
  - a second light-emitting element having light emission luminance per unit current lower than that of the first light-emitting element;
  - a third power supply wiring electrically coupled with one electrode of the second light-emitting element and to which the third potential is supplied; and
  - a fourth power supply wiring electrically coupled with another electrode of the second light-emitting element and to which the fourth potential is supplied; and
- a prism configured to synthesize a first image light emitted from the first panel and a second image light emitted from the second panel,
- wherein a first potential difference is smaller than a second potential difference, the first potential difference being a difference between the first potential and the second potential, the second potential difference being a difference between the third potential and the fourth potential.

8. The optical module according to claim 7, further comprising:
- a third substrate including a power supply circuit to which a third reference voltage is supplied and generating a fifth potential and a sixth potential;
- a third panel including:
  - a third light-emitting element having light emission luminance per unit current lower than that of the first light-emitting element;
  - a fifth power supply wiring electrically coupled with one electrode of the third light-emitting element and to which the fifth potential is supplied; and
  - a sixth power supply wiring electrically coupled with another electrode of the third light-emitting element and to which the sixth potential is supplied, wherein
- the prism synthesizes the first image light, the second image light, and a third image light emitted from the third panel; and
- the first potential difference is smaller than a third potential difference that is a difference between the fifth potential and the sixth potential.

* * * * *